United States Patent
Limjoco et al.

(10) Patent No.: US 10,320,280 B2
(45) Date of Patent: Jun. 11, 2019

(54) LC FILTER INCLUDING COUPLED INDUCTORS FOR REDUCING RIPPLE IN SWITCHING POWER SUPPLIES

(71) Applicant: Analog Devices Global Unlimited Company, Hamilton (BM)

(72) Inventors: Aldrick S. Limjoco, Dasmarinas Cavite (PH); Jefferson Albo Eco, Gen. Trias Cavite (PH)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 15/804,437

(22) Filed: Nov. 6, 2017

(65) Prior Publication Data

US 2018/0131267 A1 May 10, 2018

Related U.S. Application Data

(60) Provisional application No. 62/419,252, filed on Nov. 8, 2016.

(51) Int. Cl.
| | |
|---|---|
| *H02M 1/14* | (2006.01) |
| *H02M 3/155* | (2006.01) |
| *H03H 7/01* | (2006.01) |
| *H02M 1/15* | (2006.01) |
| *H02M 1/00* | (2006.01) |

(52) U.S. Cl.
CPC .......... *H02M 1/143* (2013.01); *H02M 3/155* (2013.01); *H03H 7/0115* (2013.01); *H02M 1/15* (2013.01); *H02M 2001/0064* (2013.01); *H03H 2210/025* (2013.01)

(58) Field of Classification Search
CPC ........ H02M 1/143; H02M 3/155; H02M 1/15; H02M 2001/0064; H02M 7/523; H03H 2210/025; H03H 7/0115
See application file for complete search history.

(56) References Cited

U.S. PATENT DOCUMENTS

| | | | |
|---|---|---|---|
| 4,703,409 A | 10/1987 | Spreen | |
| 5,378,937 A * | 1/1995 | Heidemann | ........ H04B 10/2507 327/306 |
| 8,150,351 B2 | 4/2012 | Shah et al. | |
| 8,427,120 B1 | 4/2013 | Cilio | |
| 8,885,376 B2 | 11/2014 | Meehan et al. | |
| 9,197,194 B2 | 11/2015 | Reedy et al. | |

(Continued)

FOREIGN PATENT DOCUMENTS

| | | |
|---|---|---|
| WO | WO-2007005164 A3 | 1/2007 |
| WO | WO-2012151594 A2 | 11/2012 |

OTHER PUBLICATIONS

Balog, Robert, et al., "Coupled Inductors—A Basic Filter Building Block", (Oct. 2000), 8 pgs.

*Primary Examiner* — Fred E Finch, III
*Assistant Examiner* — Demetries A Gibson
(74) *Attorney, Agent, or Firm* — Schwegman Lundberg & Woessner, P.A.

(57) ABSTRACT

An LC filter circuit reduces an output voltage ripple of a switching power supply using coupled inductors in combination with a capacitor to form a notch filter, and aligning the notch region of the notch filter with a ripple frequency of the switching power supply to attenuate the frequency region of the fundamental ripple frequency by a larger amount than other frequencies.

20 Claims, 8 Drawing Sheets

(56) References Cited

U.S. PATENT DOCUMENTS

| | | |
|---|---|---|
| 9,384,885 B2 | 7/2016 | Karalis et al. |
| 2011/0279100 A1* | 11/2011 | Ikriannikov .......... H02M 7/003 |
| | | 323/271 |
| 2013/0033118 A1 | 2/2013 | Karalis et al. |
| 2013/0187712 A1* | 7/2013 | Cabanillas ............... H03H 7/40 |
| | | 330/192 |
| 2014/0055210 A1* | 2/2014 | Black ..................... H04B 1/525 |
| | | 333/132 |
| 2015/0304100 A1* | 10/2015 | Nee ......................... H04B 1/12 |
| | | 375/130 |
| 2016/0016479 A1* | 1/2016 | Khaligh .............. B60L 11/1812 |
| | | 363/17 |
| 2016/0248319 A1* | 8/2016 | Meehan ................. H02M 1/44 |
| 2017/0291495 A1* | 10/2017 | Blum ..................... B60L 11/18 |
| 2018/0083539 A1* | 3/2018 | Reed ..................... H02M 3/335 |

* cited by examiner

LC FILTER INCLUDING COUPLED INDUCTORS FOR REDUCING RIPPLE IN SWITCHING POWER SUPPLIES

CLAIM OF PRIORITY

Benefit of priority is hereby claimed to Limjoco, et al., U.S. Provisional Application No. 62/419,252, filed Nov. 8, 2016, and titled "LC FILTER INCLUDING COUPLED INDUCTORS FOR REDUCING RIPPLE IN SWITCHING POWER SUPPLIES," the entirety of which is hereby incorporated herein by reference.

FIELD OF THE DISCLOSURE

The present disclosure relates to the field of filters used for filtering ripple in switching power supplies.

BACKGROUND

A switching power supply or switching power regulator typically uses a switch that switches on and off at a sufficiently high frequency and can generate an average steady output voltage that can be higher or lower than the input voltage. However, ripple is typically present in the output voltage. A power supply filter can be used to filter the ripple and provide an output voltage to a relatively constant direct current (DC) value.

SUMMARY OF THE DISCLOSURE

Using coupled magnetics or coupled inductors in a filter to filter an output of a switching power supply or switching power regulator can provide a significant reduction in switching power supply output ripple compared to other types of filters. Conventional power supply filters may not reduce the output ripple sufficiently to avoid deleterious noise in systems using the switching power supply, or may require a large number of components or large volume to hold the components, thereby increasing cost and board space consumption.

A filter that uses coupled magnetics or coupled inductors may include a two-stage LC low pass filter. The filter using coupled magnetics or coupled inductors may form a notch filter in which the frequency of the notch can be tuned to be close to or effectively match a fundamental frequency of the output ripple of the switching power supply. The notch filter disclosed herein may provide superior ripple attenuation compared to conventional multi-stage LC filters by using resonance to form the notch having significantly greater attenuation over a narrow frequency range than in other frequency ranges of the notch filter.

According to an embodiment, an LC filter circuit reduces an output voltage ripple of a switching power supply using coupled inductors in combination with a capacitor to form a notch filter, and aligning the notch region of the notch filter with a fundamental ripple frequency of the switching power supply to attenuate the frequency region of the fundamental ripple frequency by a larger amount than other frequencies.

According to an embodiment, a filter circuit for reducing an output voltage ripple of a switching power supply includes a coupled inductor. The coupled inductor includes a first inductor coupled to a filter input to receive an output signal from the switching power supply, and a second inductor coupled to a filter output to provide a filtered output signal and inductively coupled together with the first inductor with a coefficient of coupling $k>0$. The filter circuit also includes a capacitor having a first terminal coupled between the first inductor and the second inductor.

According to an embodiment, a method of filtering an output signal of a switching power supply includes receiving the output signal of the switching power supply, filtering a ripple in the output signal of the switching power supply, and outputting the filtered output signal to provide a reduced ripple compared to the output signal of the switching power supply. The filtering is performed by aligning a resonant notch region of a frequency response of a filter including a coupled inductor and a capacitor with a fundamental ripple frequency of the switching power supply.

According to an embodiment, a filter circuit for reducing an output voltage ripple of a switching power supply includes a coupled inductor. The coupled inductor includes a first inductor coupled to a filter input to receive an output signal from the switching power supply, and a second inductor coupled to a filter output to provide a filtered output signal and inductively coupled together with the first inductor in a series opposing configuration with a coefficient of coupling $k>0$. The filter circuit further includes a first capacitor having a first terminal coupled between the first inductor and the second inductor and having a second terminal coupled with ground, and a second capacitor having a first terminal coupled with the filter output and having a second terminal coupled with ground.

This overview is intended to provide an overview of subject matter of the present patent application. It is not intended to provide an exclusive or exhaustive explanation of the invention. The detailed description is included to provide further information about the present patent application.

Figure 1:
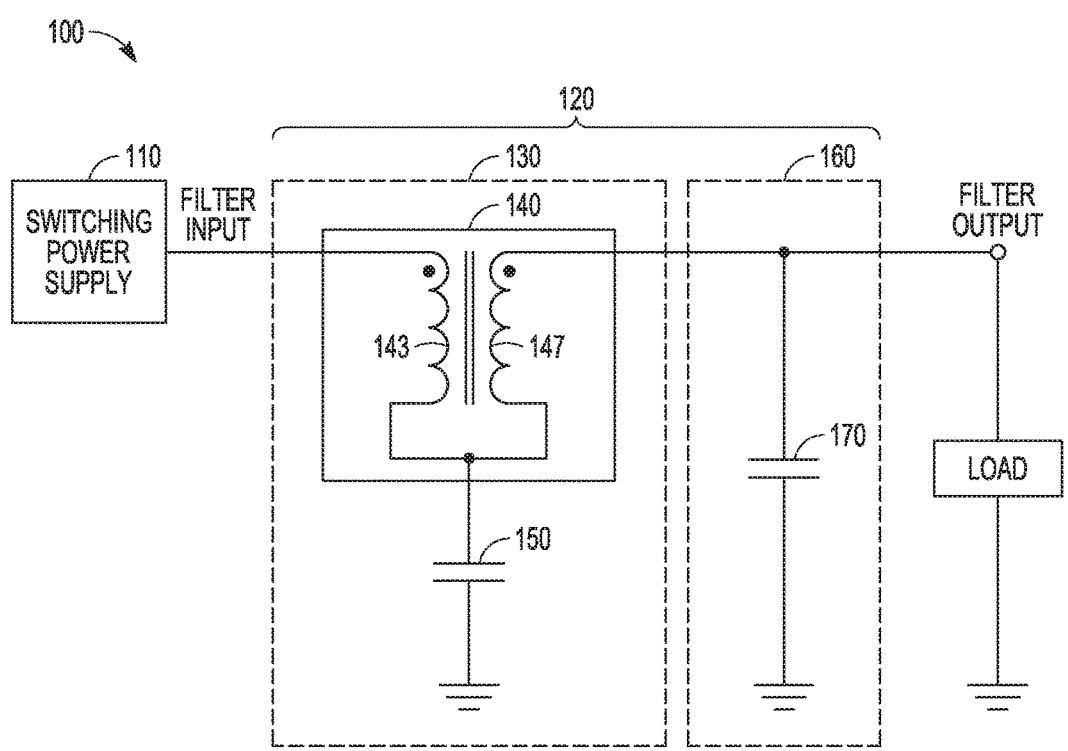
FIG. 1 illustrates a switching power supply system including a switching power supply and a power supply filter that filters a ripple in the switching power supply, according to an embodiment.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The frequency region of the notch may be considered to be close to or effectively match the fundamental frequency of the output ripple of the switching power supply when the notch's attenuation of the ripple exceeds a threshold value or is substantially equivalent to a maximum attenuation of a frequency region of the notch. For example, in an embodiment, the frequency region of the notch may be considered to be close to or effectively match the fundamental frequency of the output ripple of the switching power supply when the attenuation of the output ripple of the switching power supply is within about 3 dB of the maximum attenuation of the frequency region of the notch. In another embodiment, the frequency region of the notch may be considered to be close to or effectively match the fundamental frequency of the output ripple of the switching power supply when the attenuation of the output ripple of the switching power supply is within about 6 dB of the maximum attenuation of the frequency region of the notch.

FIG. 1 illustrates a switching power supply system 100 including a switching power supply 110 and a power supply filter 120 that filters a ripple in the output of the switching power supply 110, according to an embodiment. The switching power supply 110 may include a switching regulator or switched-mode power supply (SMPS). The switching power supply 110 may operate using pulse width modulation (PWM). The output voltage of the switching power supply 110 may switch or alternate between a high voltage and a low voltage or ground at a regular frequency. The percent of each cycle that the output voltage is at the high voltage compared to the low voltage or ground may be varied in order to determine the average output voltage of the switching power supply 110. The power supply filter 120 may smooth the output waveform of the switching power supply 110 so that a steady state direct current (DC) voltage is seen at the filter output node FILTER OUTPUT. The switching power supply 110 may include a built-in clock to regulate a switching frequency of the switching power supply 110, or the switching power supply 110 may include a clock input to regulate the switching frequency according to an external synchronization clock signal.

The power supply filter 120 may include a first filter stage 130 and a second filter stage 160. The first filter stage 130 may include a coupled inductor 140 having first and second inductors 143, 147 arranged in a series opposing configuration with a non-dotted terminal of each of the two inductors coupled together. A dotted terminal of the first inductor 143 may be coupled with the filter input and the output of the switching power supply 110 to receive an output signal from the switching power supply 110. A dotted terminal of the second inductor 147 may be coupled with an input of the second filter stage 160 via an output of the first filter stage 130 to provide a filtered output signal. The first filter stage 130 may also include a capacitor 150 having a first terminal coupled between the non-dotted terminal of the first inductor 143 and the non-dotted terminal of the second inductor 147. A second terminal of the capacitor 150 may be coupled with ground. In various embodiments, the capacitor 150 may include a fixed value capacitor. In various embodiments, the capacitor 150 may include a voltage-controlled variable capacitor or Barium Strontium Titanate (BST) capacitor to tune a resonant notch frequency region of a frequency response of the first filter stage 130. The second filter stage 160 may include a capacitor 170 having a first terminal coupled between both the input of the second filter stage 160 and the power supply filter output FILTER OUTPUT. The power supply filter output FILTER OUTPUT may be coupled with a resistive load LOAD. The resistive load LOAD may include any circuits desired to be operated using power supplied by the switching power supply system 100.

While the illustrated power supply filter 120 includes two stages, in various embodiments, additional stages may also be added to create a higher order power supply filter.

The first inductor 143 and the second inductor 147 may have various turns ratios, for example, a 1.5:1 turns ratio, a 2:1 turns ratio, 3:1 turns ratio, 4:1 turns ratio, or other values of turns ratio. The first inductor 143 and the second inductor 147 may have a coefficient of coupling k>0. In some embodiments, the first inductor may have the primary inductance, a larger inductance value than the second inductor. In other embodiments, the second inductor may have the primary inductance, a larger inductance value than the first inductor. Each of the first inductor and the second inductor may also have an inherent DC resistance (DCR), for example, on the order of hundredths of an ohm to several ohms.

In comparison with conventional LC low pass filters that may traditionally be used for filtering the output of a switching power supply, the power supply filter 120 may use fewer components and be more compact. For example, the power supply filter 120 illustrated in FIG. 1 may include only three components (the coupled inductor 140, the capacitor 150, and the capacitor 170), whereas the conventional LC low pass filter may include four or more components (e.g., two independent inductors, and two capacitors, for a two-stage LC low pass filter).

The coupled inductor 140 may be installed as a single package. The coupled inductor 140 may be packaged together with the capacitor 150, and may be encapsulated together as a coupled magnetic filter block. The power supply filter 120 may also be implemented on a semiconductor substrate or a lead frame substrate. The coupled inductor 140 and the capacitor 150 may be miniaturized and implemented together at a silicon die-level, making the first filter stage 130 suitable as an integrated filter module for power applications. In some embodiments, a discrete coupled inductor 140 may be used together with a BST capacitor 150 mounted on a customized lead frame.

The power supply filter 120 may form a notch region in its frequency response that when aligned with the fundamental ripple frequency of the switching power supply 110, may significantly reduce the amount of the ripple in the filtered output at the output FILTER OUTPUT. The notch region may be formed due to the series resonance formed by the mutual inductance of the coupled inductor 140 in combination with the capacitor 150 coupled to the coupled inductor 140. However, when the notch region of the frequency response is not aligned with the fundamental ripple frequency of the switching power supply 110, the power supply filter 120 may not be more effective at reducing the ripple of the switching power supply 110 than conventional power supply filters.

Various component parameter variances from ideal values of the power supply filter 120 and/or the switching power supply 110, such as due to manufacturing tolerances and variations, component tolerances with respect to temperature and DC bias, coupling variations from part to part, and availability of components with exact design parameter values, may cause the notch region of the power supply filter 120 to not be well-aligned with the fundamental ripple frequency of the switching power supply 110. This is because the notch region of the frequency response may be dependent upon the inductor values of both the first inductor 143 and the second inductor 147, the mutual inductance between the first and second inductors 143, 147, and the capacitance value of the capacitor 150. These component parameter variations can be compensated for by the use of a variable value capacitor as the capacitor 150. The variable value capacitor may include a Barium Strontium Titanate (BST) capacitor or a Varactor as a tuning element. By tuning the value of the tuning element, the notch region of the power supply filter 120's frequency response may be adjusted to align with the fundamental ripple frequency of the switching power supply 110 in order to provide the highest amount of ripple suppression that the power supply filter 120 is designed to provide.

Figure 2A:
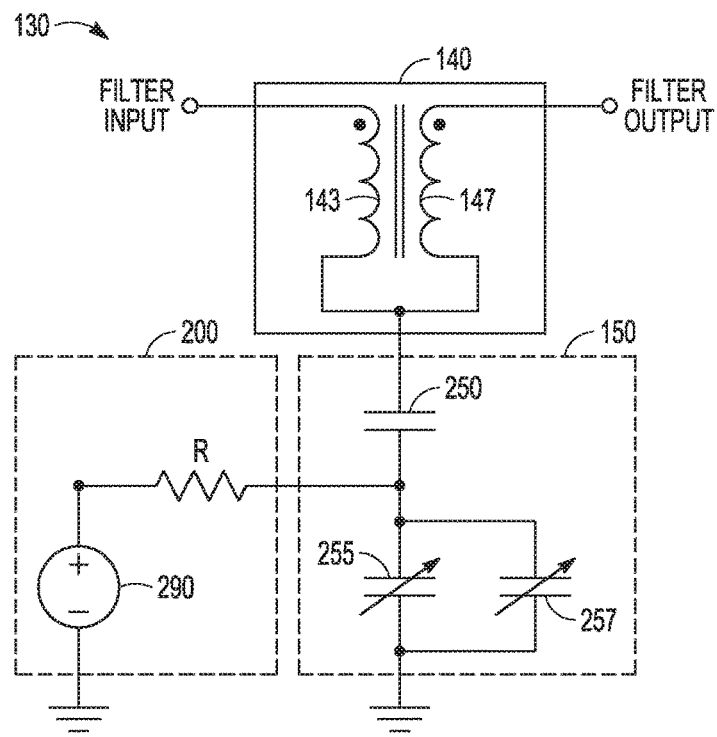
FIGS. 2A and 2B illustrate a tuning circuit for the power supply filter illustrated in FIG. 1, according to several embodiments.
Figure 2B:
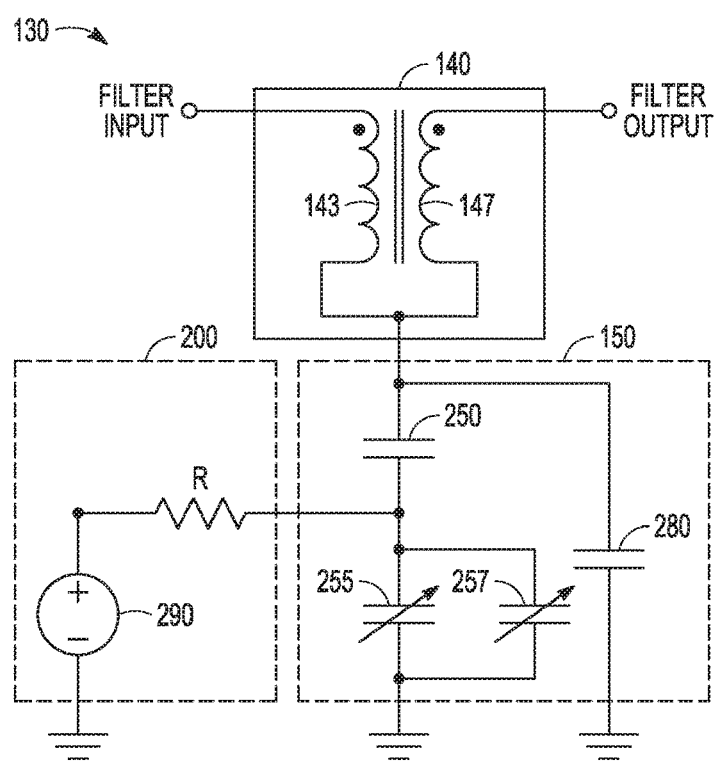

FIGS. 2A and 2B illustrate a tuning circuit 200 for the power supply filter 120 illustrated in FIG. 1, according to several embodiments. FIGS. 2A and 2B illustrate the coupled inductor 140 and the capacitor 150 forming the first filter stage 130 of FIG. 1 together with the tuning circuit 200. FIG. 2A illustrates an embodiment of the capacitor 150 including a fixed value capacitor 250 having a first terminal coupled with the coupled inductor 140 between a non-dotted terminal of the first inductor 143 and a non-dotted terminal of the second inductor 147, and a second terminal coupled with a first terminal of both a variable BST capacitor 255 and a variable BST capacitor 257 coupled in parallel between the fixed value capacitor 250 and ground.

The tuning circuit 200 may include a variable value DC voltage source 290 and a resistor R coupled between the DC voltage source 290 and the first terminal of the variable BST capacitors 255 and 257. The capacitance value of the capacitor 150 may be varied by varying the DC voltage of the DC voltage source 290. In various embodiments, the DC voltage of the DC voltage source 290 may be adjusted manually or automatically according to system measurements or a feedback loop.

FIG. 2B illustrates an embodiment of the capacitor 150 which is similar to the embodiment of the capacitor 150 illustrates in FIG. 2A, except that the embodiment of the capacitor 150 illustrated in FIG. 2B further includes a second fixed value capacitor 280 having a first terminal coupled with the coupled inductor 140 between the non-dotted terminal of the first inductor 143 and the non-dotted terminal of the second inductor 147, and a second terminal coupled to ground. The addition of the second fixed value capacitor 280 in the embodiment of FIG. 2B facilitates an increase in the variable capacitance values that the capacitor 150 can be tuned to provide. Either or both of the fixed value capacitors 250 and 280 may include a BST capacitor.

Figure 3:
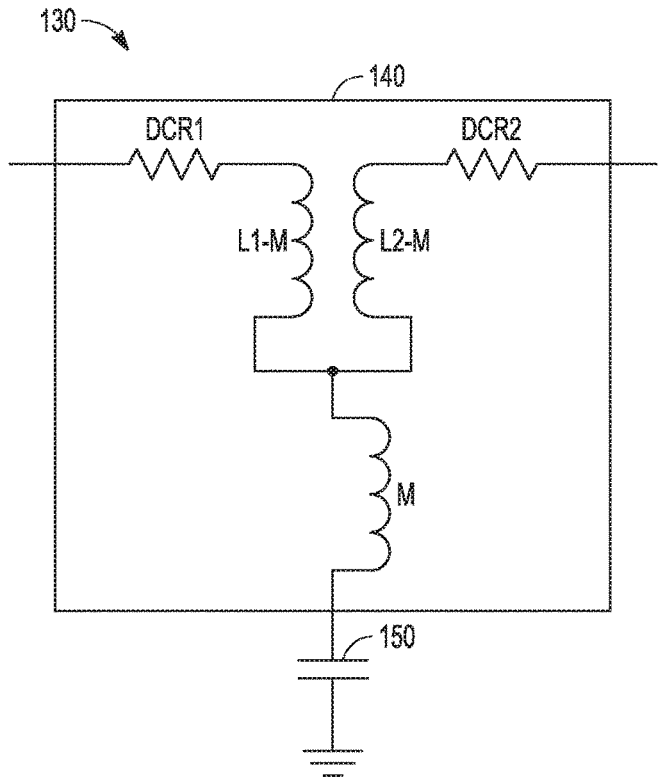
FIG. 3 illustrates an equivalent circuit diagram for the first filter stage including the coupled inductor and the capacitor of the power supply filter illustrated in FIG. 1, according to an embodiment.

FIG. 3 illustrates an equivalent circuit diagram for the first filter stage 130 including the coupled inductor 140 and the capacitor 150 of the power supply filter 120 illustrated in FIG. 1, according to an embodiment. The first inductor 143 may be represented as a DC resistance DCR1 in series with an inductance L1-M, where L1 equals the inductance value of the first inductor 143 and M equals the mutual inductance between the first inductor 143 and the second inductor 147. The second inductor 147 may be represented as a DC resistance DCR2 in series with an inductance L2-M, where L2 equals the inductance value of the second inductor 147. The mutual inductance M between the first inductor 143 and the second inductor 147 is represented by an inductor having a value M and having a first terminal coupled between the second terminals of the first and second inductors 143, 147 and a second terminal coupled with the capacitor 150. In various embodiments, the value of M depends upon the inductance values for each of the first and second inductors 143, 147, as well as their coefficient of coupling k. In circuit simulations, the first filter stage 130 would be represented as resistors having values DCR1 and DCR2 coupled in series with uncoupled inductances having values L1-M and L2-M and an uncoupled inductance having a value M with one terminal coupled between the two uncoupled inductances having values L1-M and L2-M as illustrated in FIG. 3 to account for the DC resistance of each of the inductors 143, 147 in the coupled inductor 140 as well as their mutual inductance.

Figure 4:
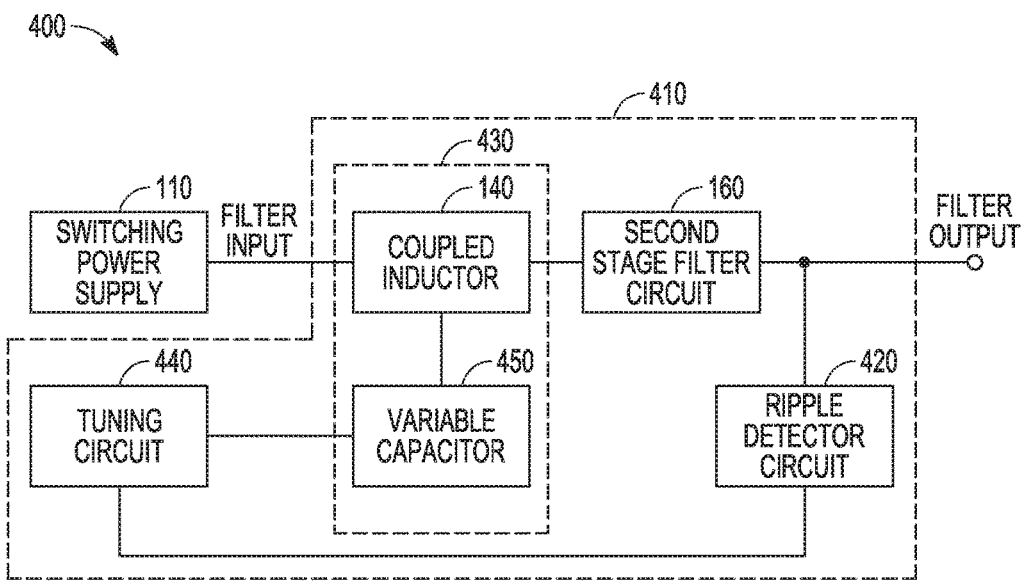
FIG. 4 illustrates a switching power supply system including an auto-tuned power supply filter circuit, according to an embodiment.

FIG. 4 illustrates a switching power supply system 400 including an auto-tuned power supply filter circuit 410, according to an embodiment. The auto-tuned power supply filter circuit 410 includes a first filter stage 430 and a second filter stage 160. The first filter stage 430 includes a coupled inductor 140 and a variable capacitor 450. The variable capacitor 450 may be an embodiment of the capacitor 150, and the first filter stage 430 may be an embodiment of the first filter stage 130 where the variable capacitor 450 is substituted for the capacitor 150. The variable capacitor 450 may function by changing a capacitance of a variable capacitor in response to a change in voltage potential across the capacitor. For example, a change in potential across a variable BST capacitor can cause its relative permittivity to vary and therefore also the capacitance of the variable BST capacitor.

The auto-tuned power supply filter circuit 410 may also include a ripple detector circuit 420 having an input coupled with the output of the auto-tuned power supply filter circuit 410 to detect a ripple in the auto-tuned power supply filter circuit 410's output FILTER OUTPUT and having an output coupled with a tuning circuit 440 to output a ripple information signal to the tuning circuit 440 according to the detected ripple. The ripple detector circuit 420 may detect a magnitude or amplitude of the ripple from the switching power supply 110 that passes through the auto-tuned power supply filter circuit 410.

The tuning circuit 440 may have an output coupled with a variable capacitance tuning port of the variable capacitor 450. The variable capacitor 450 may include an embodiment of the capacitor 150 illustrated in FIG. 2A or FIG. 2B. The tuning circuit 440 may include an embodiment of the tuning circuit 200 illustrated in FIGS. 2A and 2B. The tuning circuit 440 may tune a capacitance value of the variable capacitor 450 to align a resonant notch region of a frequency response of the auto-tuned power supply filter circuit 410 with a fundamental ripple frequency of the switching power supply 110. The ripple information signal output from the ripple detector circuit 420 to the tuning circuit 440 may control a DC voltage applied to the variable capacitor 450 via the variable capacitance tuning port of the variable capacitor 450.

The auto-tuned power supply filter circuit 410 may operate by detecting a ripple in the auto-tuned power supply filter circuit 410's output FILTER OUTPUT and adjusting a DC voltage applied to the variable capacitance tuning port of the variable capacitor 450 in response to the detected ripple.

When adjusting the DC voltage in one direction (either upward or downward) causes the ripple to decrease in amplitude or magnitude, the DC voltage may continue to be adjusted in that direction until the ripple is no longer detected or reaches a minimum value. The DC voltage may then be held at that value until the ripple increases in amplitude or magnitude, at which time the DC voltage may again be adjusted. When adjusting the DC voltage in one direction causes the ripple to increase in amplitude or magnitude, the DC voltage may be adjusted in an opposite direction until the ripple is no longer detected or reaches a minimum value.

Figure 5:
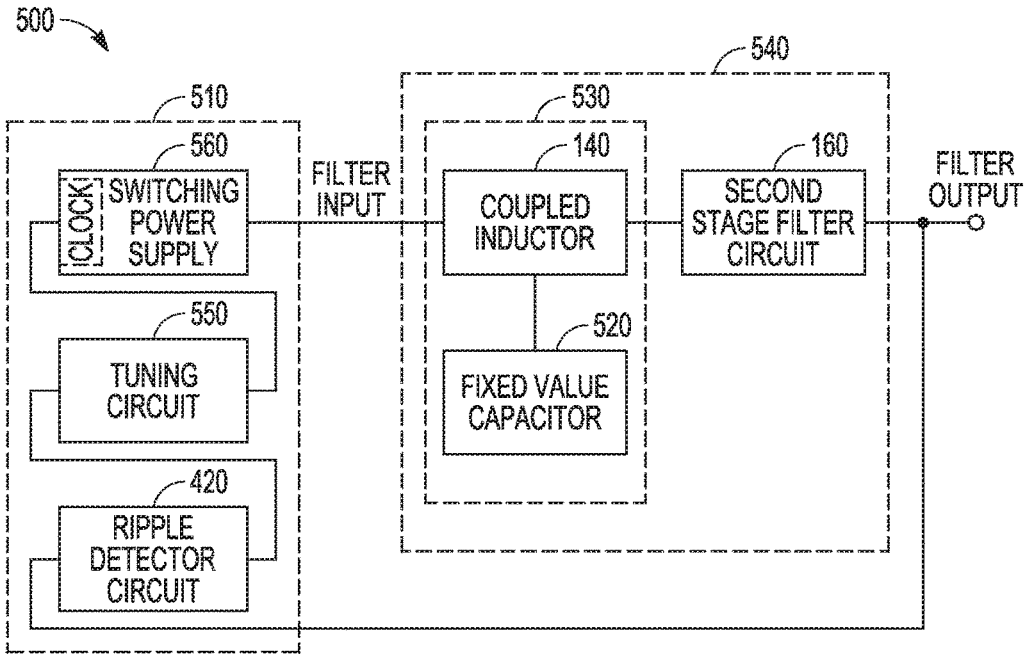
FIG. 5 illustrates a switching power supply system including an auto-tuned switching power supply, according to an embodiment.

FIG. 5 illustrates a switching power supply system 500 including an auto-tuned switching power supply 510, according to an embodiment. A power supply filter circuit 540 includes a first filter stage 530 and a second filter stage 160. The first filter stage 530 includes a coupled inductor 140 and a fixed value capacitor 520. The fixed value capacitor 520 may be an embodiment of the capacitor 150, and the first filter stage 530 may be an embodiment of the first filter stage 130 where the fixed value capacitor 520 is substituted for the capacitor 150.

A ripple detector circuit 420 includes an input coupled with the output of the power supply filter circuit 540 to detect a ripple in the power supply filter circuit 540's output FILTER OUTPUT and includes an output coupled with a tuning circuit 550 to output a ripple information signal to the tuning circuit 550 according to the detected ripple. The ripple detector circuit 420 may detect an amplitude or magnitude of the ripple from the auto-tuned switching power supply 510 that passes through the power supply filter circuit 540.

The tuning circuit 550 may have an output coupled with a clock input of a switching power supply 560. The switching power supply 560 may be an embodiment of the switching power supply 110 having an external synchronization clock input. The tuning circuit 550 may adjust a clock frequency of the switching power supply 560 to adjust a switching frequency of the switching power supply 560 and align a fundamental ripple frequency of the switching power supply 560 with a resonant notch region of a frequency response of the power supply filter circuit 540. The ripple information signal output from the ripple detector circuit 420 to the tuning circuit 550 may control a clock frequency of the switching power supply 560.

The auto-tuned switching power supply 510 may operate by detecting a ripple in the power supply filter circuit 540's output FILTER OUTPUT and adjusting a clock frequency input to the external synchronization clock input port of the switching power supply 560 in response to the detected ripple. When adjusting the clock frequency in one direction (either upward or downward) causes the ripple to decrease in amplitude or magnitude, the clock frequency may continue to be adjusted in that direction until the ripple is no longer detected or reaches a minimum value. The clock frequency may then be held at that value until the ripple increases in amplitude or magnitude, at which time the clock frequency may again be adjusted. When adjusting the clock frequency in one direction causes the ripple to increase in amplitude or magnitude, the clock frequency may be adjusted in an opposite direction until the ripple is no longer detected or reaches a minimum value.

Figure 6:
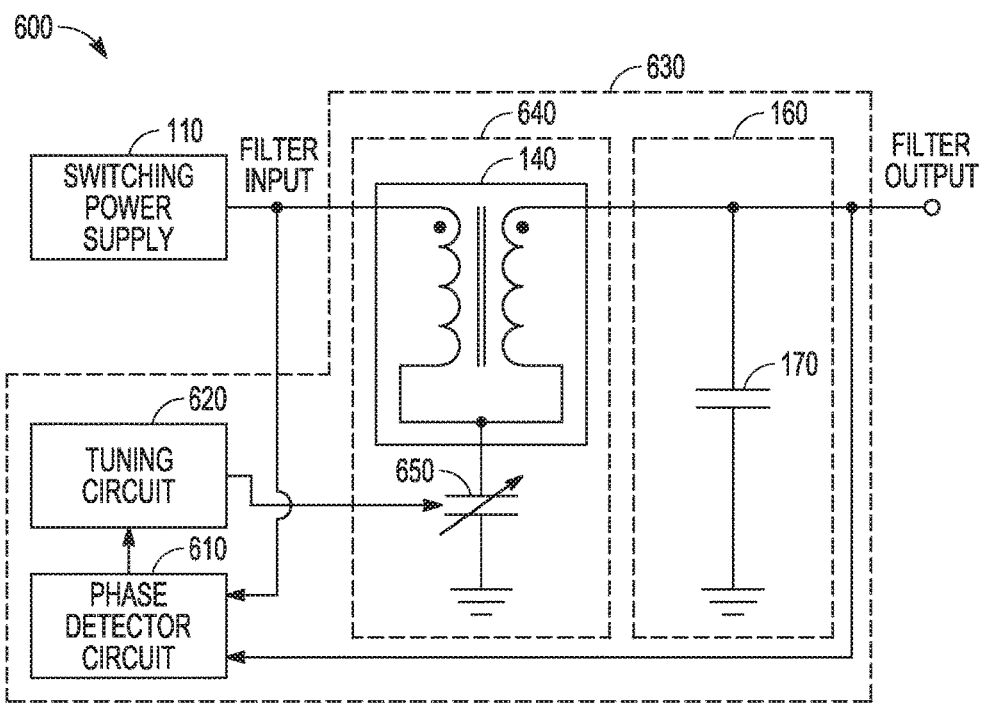
FIG. 6 illustrates a switching power supply system including an auto-tuned power supply filter circuit, according to an embodiment.

FIG. 6 illustrates a switching power supply system 600 including an auto-tuned power supply filter circuit 630, according to an embodiment. The auto-tuned power supply filter circuit 630 includes a first filter stage 640 and a second filter stage 160. The first filter stage 640 includes a coupled inductor 140 and a variable capacitor 650. The variable capacitor 650 may be an embodiment of the capacitor 150, and the first filter stage 640 may be an embodiment of the first filter stage 130 where the variable capacitor 650 is substituted for the capacitor 150.

The auto-tuned power supply filter circuit 630 may also include a phase detector circuit 610 having a first input coupled with an input of the auto-tuned power supply filter circuit 630 to detect a phase in the switching power supply 110's output and the auto-tuned power supply filter circuit 630's input FILTER INPUT, having a second input coupled with the output of the auto-tuned power supply filter circuit 630 to detect a phase in the auto-tuned power supply filter circuit 630's output FILTER OUTPUT, and having an output coupled with a tuning circuit 620 to output a phase difference signal to the tuning circuit 620 according to the detected phase difference between the input and the output of the auto-tuned power supply filter circuit 630. The phase difference can be determined from the phase of the fundamental ripple frequency at the auto-tuned power supply filter circuit 630's output FILTER OUTPUT compared with the phase of the fundamental ripple frequency at the auto-tuned power supply filter circuit 630's input FILTER INPUT. The phase detector circuit 610 may include an analog multiplier to provide a zero average output or a zero error voltage to the tuning circuit 620 for a 90 degree phase shift between the first and second inputs of the phase detector circuit 610 to facilitate alignment of a resonant notch region of a frequency response of the auto-tuned power supply filter circuit 630 with a fundamental ripple frequency of the switching power supply 110.

The tuning circuit 620 may have an output coupled with a variable capacitance tuning port of the variable capacitor 650. The variable capacitor 650 may include an embodiment of the capacitor 150 illustrated in FIG. 2A or FIG. 2B. The tuning circuit 620 may include an embodiment of the tuning circuit 200 illustrated in FIGS. 2A and 2B. The tuning circuit 620 may tune a capacitance value of the variable capacitor 650 to align the resonant notch region of the frequency response of the auto-tuned power supply filter circuit 630 with the fundamental ripple frequency of the switching power supply 110. The phase difference information signal output from the phase detector circuit 610 to the tuning circuit 620 may control a DC voltage applied to the variable capacitor 650 via the variable capacitance tuning port of the variable capacitor 650.

The auto-tuned power supply filter circuit 630 may operate by detecting a phase difference of the ripple in the auto-tuned power supply filter circuit 630's output FILTER OUTPUT compared to the ripple in the auto-tuned power supply filter circuit 630's input FILTER INPUT and adjusting a DC voltage applied to the variable capacitance tuning port of the variable capacitor 650 in response to the detected phase difference. When adjusting the DC voltage in one direction (either upward or downward) causes the error voltage from the phase detector output to decrease in magnitude, the DC voltage may continue to be adjusted in that direction until the error voltage is no longer detected or reaches a minimum value. The DC voltage may then be held at that value until the error voltage from the phase detector output increases in magnitude, at which time the DC voltage may again be adjusted. When adjusting the DC voltage in one direction causes the error voltage from the phase detector output to increase in magnitude, the DC voltage may be adjusted in an opposite direction until the error voltage from the phase detector output is no longer detected or reaches a minimum value. When the phase difference of the fundamental ripple is 90 degrees between the power supply filter circuit 630's input FILTER INPUT and output FILTER OUTPUT, the resonant notch frequency of the auto-tuned power supply filter circuit 630 is considered to be tuned to the fundamental ripple frequency of the switching power supply 110. When the resonant notch frequency of the auto-tuned power supply filter circuit 630 is considered to be tuned to the fundamental ripple frequency of the switching power supply 110, the phase detector circuit 610 may output the phase difference signal as a DC error signal with an average zero value or a value sufficiently close to zero to not have a significant effect on the operation of the tuning circuit 620.

Figure 7:
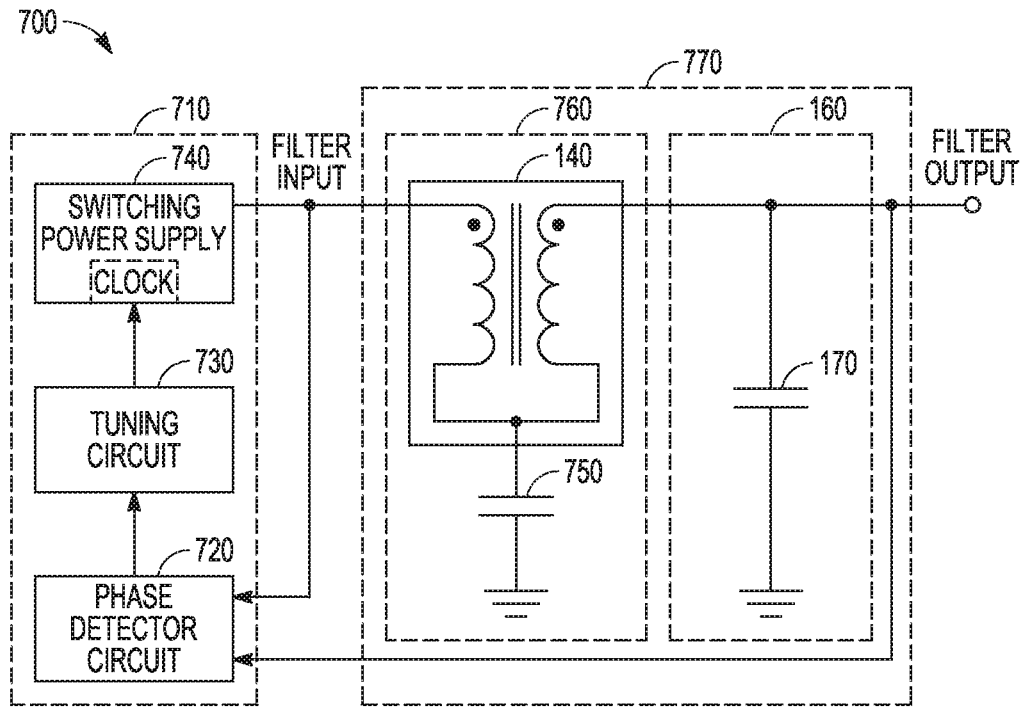
FIG. 7 illustrates a switching power supply system including an auto-tuned switching power supply, according to an embodiment.

FIG. 7 illustrates a switching power supply system 700 including an auto-tuned switching power supply 710, according to an embodiment. A power supply filter circuit 770 includes a first filter stage 760 and a second filter stage 160. The first filter stage 760 includes a coupled inductor 140 and a fixed value capacitor 750. The fixed value capacitor 750 may be an embodiment of the capacitor 150, and the first filter stage 760 may be an embodiment of the first filter stage 130 where the fixed value capacitor 750 is substituted for the capacitor 150.

A phase detector circuit 720 includes a first input coupled with the input of the power supply filter circuit 770 and a second input coupled with the output of the power supply filter circuit 770 to detect a phase difference of the output signal from the auto-tuned switching power supply 710 and power supply filter circuit 770's input FILTER INPUT compared with the power supply filter circuit 770's output FILTER OUTPUT, and includes an output coupled with a tuning circuit 730 to output a phase difference information signal to the tuning circuit 730 according to the detected phase difference. The phase difference can be determined from the phase of the fundamental ripple frequency at the power supply filter circuit 770's output FILTER OUTPUT compared with the phase of the fundamental ripple frequency at the power supply filter circuit 770's input FILTER INPUT. The phase detector circuit 720 may include an analog multiplier to provide a zero average output or zero error voltage to the tuning circuit 730 for a 90 degree phase shift between the first and second inputs of the phase detector circuit 770 to facilitate alignment of a fundamental ripple frequency of a switching power supply 740 with a resonant notch region of a frequency response of the auto-tuned power supply filter circuit 770.

The tuning circuit 730 has an output coupled with a clock input of the switching power supply 740. The switching power supply 740 may be an embodiment of the switching power supply 110 having an external synchronization clock input. The tuning circuit 730 may adjust a clock frequency of the auto-tuned switching power supply 740 to adjust a switching frequency of the auto-tuned switching power supply 740 and align the fundamental ripple frequency of the auto-tuned switching power supply 740 with the resonant notch region of the frequency response of the power supply filter circuit 770. The phase difference information signal output from the phase detector circuit 720 to the tuning circuit 730 may control a clock frequency of the switching power supply 740.

The auto-tuned switching power supply 710 may operate by detecting a phase difference of the ripple in the power supply filter circuit 770's output FILTER OUTPUT compared to the ripple in the power supply filter circuit 770's input FILTER INPUT and adjusting a clock frequency input to the external synchronization clock input port of the switching power supply 740 in response to the detected phase difference. When adjusting the clock frequency in one direction (either upward or downward) causes the error voltage from the phase detector output to decrease in magnitude, the clock frequency may continue to be adjusted in that direction until the error voltage is no longer detected or reaches a minimum value. The clock frequency may then be held at that value until the error voltage from the phase detector output increases in magnitude, at which time the clock frequency may again be adjusted. When adjusting the clock frequency in one direction causes the error voltage from the phase detector output to increase in magnitude, the clock frequency may be adjusted in an opposite direction until the error voltage from the phase detector output is no longer detected or reaches a minimum value. When the phase difference of the fundamental ripple is 90 degrees between the power supply filter circuit 770's input FILTER INPUT and output FILTER OUTPUT, the fundamental ripple frequency of the switching power supply 740 is considered to be tuned to the resonant notch frequency of the power supply filter circuit 770. When the fundamental ripple frequency of the auto-tuned switching power supply 710 is considered to be tuned to the resonant notch frequency of the power supply filter circuit 770, the phase detector circuit 720 may output the phase difference signal as a DC error signal with an average zero value or a value sufficiently close to zero to not have a significant effect on the operation of the tuning circuit 730.

Figure 8:
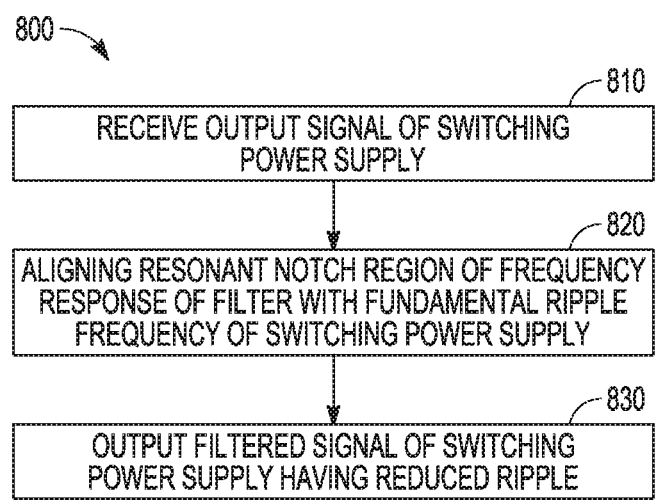
FIG. 8 illustrates a method of filtering an output signal of a switching power supply, according to an embodiment.

FIG. 8 illustrates a method 800 of filtering an output signal of a switching power supply, according to an embodiment. In a step 810, an output signal of a switching power supply is received. The output signal received from the switching power supply may include ripple at a fundamental ripple frequency.

In a step 820, ripple in the output signal of the switching power supply is filtered by aligning a resonant notch region of a frequency response of a filter including a coupled inductor and a capacitor with a fundamental ripple frequency of the switching power supply. In an embodiment, the ripple of the filtered output signal may be measured, and the aligning of the resonant notch region of the frequency response of the filter with the fundamental ripple frequency of the switching power supply is according to the measured ripple of the filtered output signal.

In an embodiment, aligning the resonant notch region of the frequency response of the filter including a coupled inductor and a capacitor with the fundamental ripple frequency of the switching power supply may be performed by tuning a capacitance value of the capacitor of the filter.

In an embodiment, aligning the fundamental ripple frequency of the switching power supply with the resonant notch region of the frequency response of the filter including a coupled inductor and a capacitor may be performed by tuning a switching frequency of the switching power supply.

The output of the filter including a coupled inductor and a capacitor may also be filtered by a second filter stage including a capacitor.

In a step 830, a filtered output signal is output to provide a reduced ripple compared to the output signal of the switching power supply.

Figure 9:
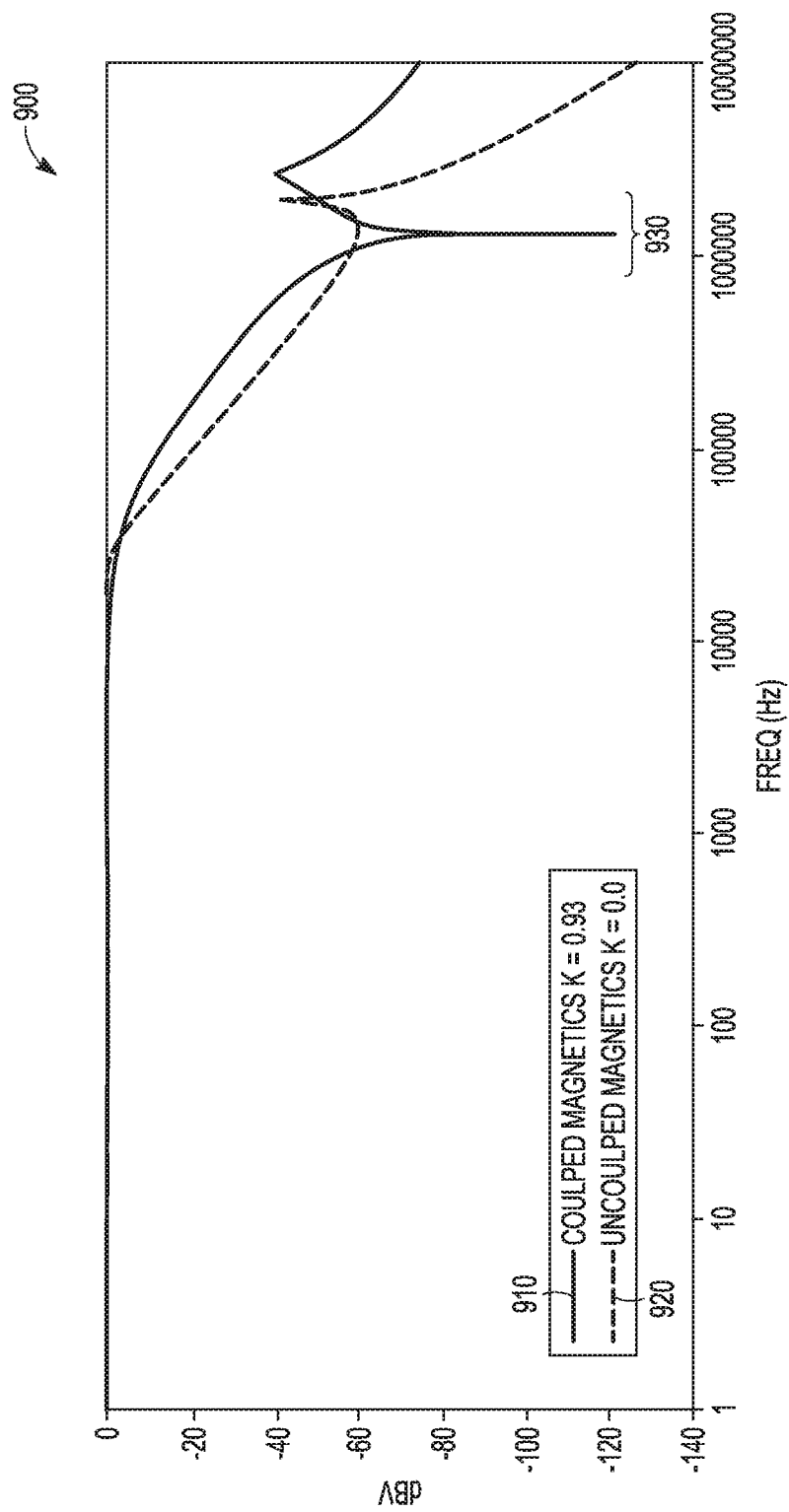
FIG. 9 illustrates a comparison of a frequency response of a power supply filter having coupled inductors with a frequency response of a power supply filter having uncoupled inductors, according to an embodiment.

FIG. 9 illustrates a comparison of a frequency response plot 910 of a power supply filter having coupled inductors with a frequency response plot 920 of a power supply filter having uncoupled inductors, according to an embodiment. The simulated frequency response is shown at the power supply filter output FILTER OUTPUT. The frequency response plots 910 and 920 illustrated in FIG. 9 may be produced by simulating the switching power supply system 100 using the equivalent circuit for the first filter stage 130 shown in FIG. 3 with an alternating current (AC) source replacing the switching power supply 110 ranging in frequency across the range of frequencies shown in the simulated frequency response graph. The frequency response plot 910 may represent a frequency response when the coupled magnetics have a coefficient of coupling k=0.93, while the frequency response plot 920 may represent a frequency response when the coupled magnetics are not coupled, but have a coefficient of coupling k=0. In the simulations, DCR1=200 mΩ, DCR2=100 mΩ, L1=1 µH, L2=250 nH, capacitance of capacitor 150=30 nF, capacitance of capacitor 170=22 µF, and resistance of LOAD=100Ω.

As shown by the simulation results illustrated in FIG. 9, inductively coupling the first inductor 143 and the second inductor 147 together creates a notch region 930 not present in the frequency response when the first inductor 143 and the second inductor 147 are not inductively coupled. As illustrated, the notch region 930 may be around 1 MHz to 2 MHz, which may correspond with typical switching frequencies of ripple in switching power supplies. In various embodiments, the notch region 930 may be designed to be anywhere from about 500 kHz to 3 MHz to correspond with primary ripple frequencies of various embodiments of switching power supplies or regulators, although this range should not be considered as limiting, as different values and ranges for the notch region may also be realized.

Aligning the notch region 930 with a fundamental ripple frequency of the switching power supply 110 facilitates a greater reduction in ripple by the power supply filter 120 when the first inductor 143 and the second inductor 147 are inductively coupled together compared to when the first inductor 143 and the second inductor 147 are not inductively coupled. This illustrates that coupled magnetics in a two stage LC power supply filter can provide greater reduction in output ripple than conventional multi-stage LC filters. Furthermore, as discussed with respect to FIG. 1, the coupled magnetics facilitate a reduction in volume and component count of the power supply filter using coupled magnetics compared to conventional multi-stage LC filters.

Figure 10:
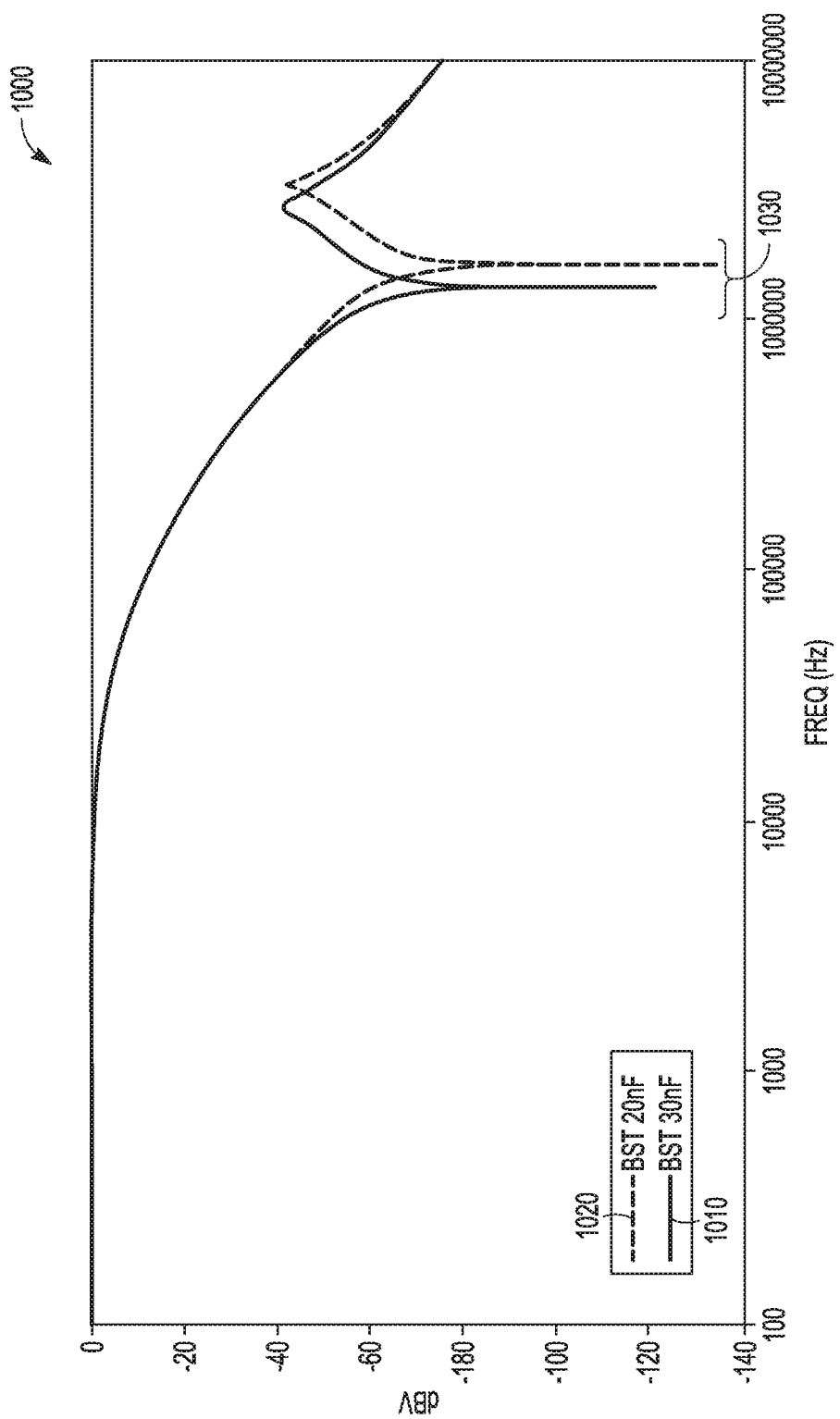
FIG. 10 illustrates a comparison of frequency responses of a power supply filter having a variable capacitor at two different capacitance values, according to an embodiment.

FIG. 10 illustrates a comparison of frequency response plots 1010, 1020 of a power supply filter having a variable capacitor at two different capacitance values, according to an embodiment. The simulations to generate the frequency response plots 1010, 1020 illustrated in FIG. 10 are performed using the same equivalent circuit as used for the coupled frequency response plot 910 of FIG. 9, with the frequency response plot 1010 generated using a capacitance value of 30 nF for the capacitor 150 and the frequency response plot 1020 generated using a capacitance value of 20 nF for the capacitor 150. As illustrated, tuning the capacitance value of the capacitor 150 facilitates tuning a notch region 1030 of the frequency response of the power supply filter. As illustrated, increasing the capacitance of the capacitor 150 reduces the central frequency of the notch region 1030 of the frequency response, and vice versa.

Figure 11:
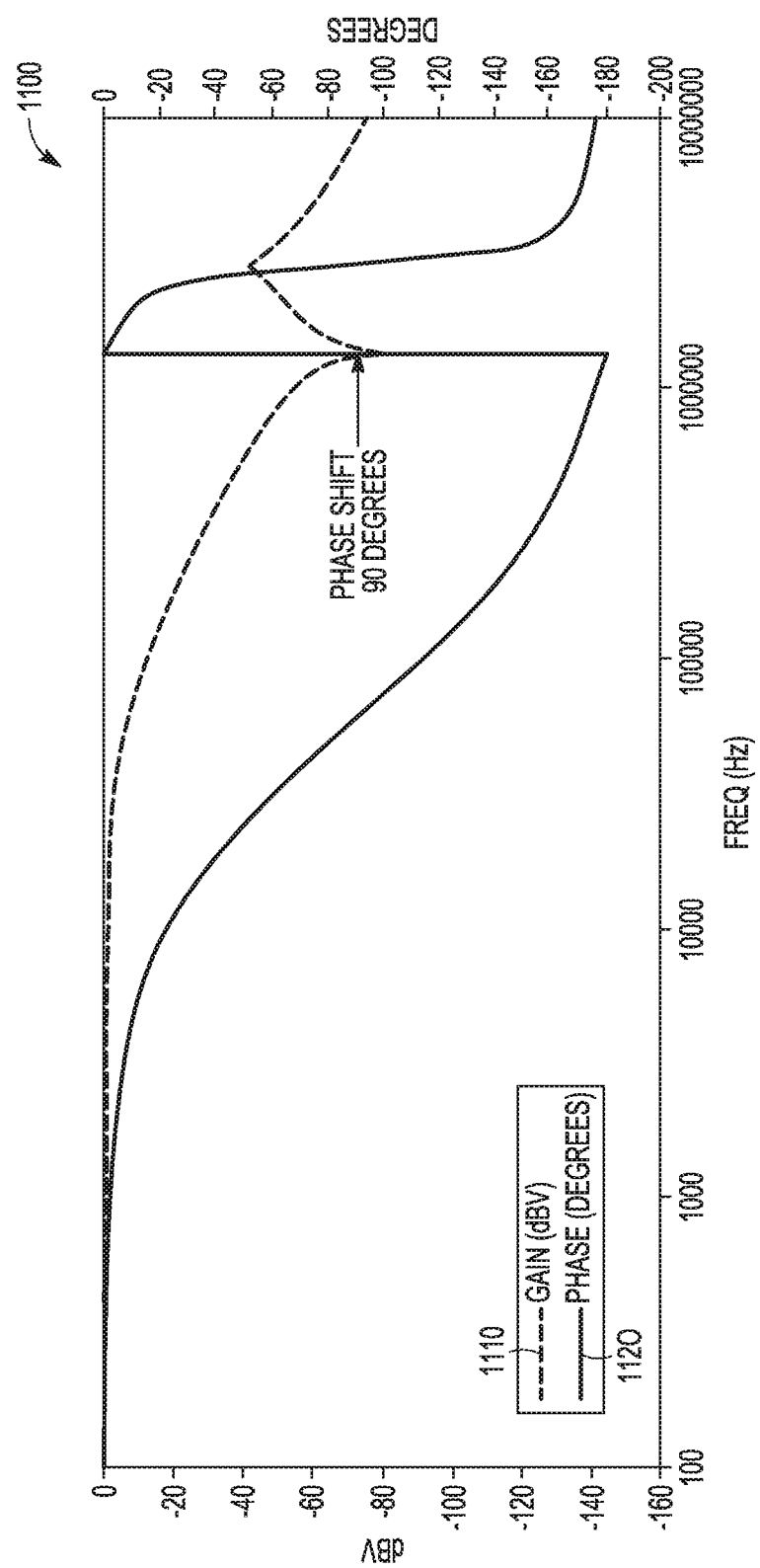
FIG. 11 illustrates a filter transfer function of an auto-tuned switching power supply system, according to an embodiment.

FIG. 11 illustrates a filter transfer function 1100 of an auto-tuned switching power supply system, according to an embodiment. The filter transfer function 1100 includes a gain frequency response plot 1110 and a phase frequency response plot 1120 generated through simulations using the same equivalent circuit as used for the coupled frequency response plots 910 of FIG. 9 and 1010 of FIG. 10. The gain frequency response plot 1110 corresponds to the frequency response plots 910 illustrated in FIGS. 9 and 1010 illustrated in FIG. 10. In addition, the phase frequency response plot 1120 illustrates that at the resonant notch frequency of the power supply filter, the phase response or the phase difference between the output and input of the power supply filter is −90 degrees. There is a very steep slope of the phase response at the resonant notch frequency region because the filter Q is very high.

Any feature of any of the embodiments described herein may optionally be used in combination with any other embodiment. Also, any of the embodiments described herein may optionally include any subset of the components or features discussed herein.

VARIOUS NOTES & EXAMPLES

Each of the non-limiting aspects above can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A filter circuit for reducing an output voltage ripple of a switching power supply, the filter circuit comprising:
    a magnetically-coupled inductor circuit including:
        a first inductor including a first terminal defining a filter input to receive an output signal from the switching power supply; and
        a second inductor including a second terminal defining a filter output to provide a filtered output signal, the second inductor inductively coupled with the first inductor and conductively coupled to the first inductor;
    a first stage capacitor coupled to a node between the first inductor and the second inductor, the first stage capacitor comprising a first variable capacitor; and
    a tuning circuit having an input to receive information indicative of the output voltage ripple of the filtered output signal, and having an output coupled to the first stage capacitor, the output of the tuning circuit configured to align a resonant notch region of a frequency response of the filter circuit with a ripple frequency of the switching power supply by adjusting a capacitance value provided by the first variable capacitor.

2. The filter circuit of claim 1,
    wherein the tuning circuit comprises an output coupled to the switching power supply to align a ripple frequency of the switching power supply with the resonant notch region of the frequency response of the filter circuit.

3. The filter circuit of claim 1, wherein the first variable capacitor includes a voltage controlled capacitor.

4. The filter circuit of claim 1, wherein the first variable capacitor is connected between a first fixed value capacitor and ground; and
    wherein the filter circuit comprises:
        a variable direct current (DC) voltage source; and
        a resistor coupled between the variable DC voltage source and a node between the first fixed value capacitor and the first variable capacitor.

5. The filter circuit of claim 4, further comprising a second variable capacitor connected in parallel with the first variable capacitor.

6. The filter circuit of claim 5, comprising a second fixed value capacitor having a terminal coupled between the first inductor and the second inductor and having another terminal coupled to ground.

7. The filter circuit of claim 1, wherein the first variable capacitor includes a barium strontium titanate dielectric.

8. The filter circuit of claim 1, wherein the output of the tuning circuit is configured to align a switching frequency of the switching power supply with the resonant notch region of the frequency response of the filter circuit by adjusting the switching frequency of the switching power supply.

9. The filter circuit of claim 1, comprising
    a phase detector circuit having a first input coupled to an input of the filter circuit and a second input coupled to an output of the filter circuit detect a phase difference of a filtered output signal compared to the output signal from the switching power supply received at the filter input, and having an output to output a phase difference information signal according to the detected phase difference;
    wherein the tuning circuit includes an input coupled to the output of the phase detector circuit; and
    wherein the tuning circuit is configured to at least one of (1) align the resonant notch region of the frequency response of the filter circuit with the ripple frequency of the switching power supply using the phase difference information signal or (2) align the ripple frequency of the switching power supply with the resonant notch region of the frequency response of the filter circuit using the detected phase difference.

10. The filter circuit of claim 1, further comprising a second filter stage coupled to the filter output to further filter the filtered output signal, the second filter stage including a second stage capacitor coupled between the filter output and ground.

11. The filter circuit of claim 1, wherein the first inductor and the second inductor are magnetically coupled in a series opposing configuration.

12. The filter circuit of claim 1, wherein a count of turns of the first inductor and a count of turns of the second inductor defines a turns ratio of at least 1.5:1.

13. The filter circuit of claim 1, wherein the output of the tuning circuit is coupled to a synchronization clock of the switching power supply to align a fundamental ripple frequency of the switching power supply with a resonant notch frequency of the frequency response of the filter circuit.

14. A system, comprising:
    a switching power supply;
    an output filter circuit coupled to an output of the switching power supply, the output filter circuit comprising:
        at least two mutually-magnetically-coupled inductors; and
        a capacitor coupled to a node between the mutually-magnetically-coupled inductors, the capacitor comprising a variable capacitor:
    wherein a capacitance value of the variable capacitor is electronically adjustable to align a resonant notch region of a frequency response of the output filter circuit with a ripple frequency of the switching power supply; and
    wherein the capacitor is coupled to a node other than an output node of the output filter circuit.

15. The system of claim 14, where a switching frequency of the switching power supply is adjustable to align the ripple frequency of the switching power supply with the resonant notch region of the frequency response of the output filter circuit.

16. The system of claim 14, comprising:
   a phase detector circuit having a first input coupled to an input of the output filter circuit and a second input coupled to an output of the output filter circuit to detect a phase difference of a filtered output signal compared to an output signal from the switching power supply received at an output filter circuit input, and having an output to output a phase difference information signal according to the detected phase difference; and
   a tuning circuit comprising an input coupled to the output of the phase detector circuit; and
   wherein the tuning circuit is configured to electronically adjust the variable capacitor to align the resonant notch region of the frequency response of the output filter circuit with a ripple frequency.

17. A method of filtering an output signal of a switching power supply, the method comprising:
   receiving the output signal of the switching power supply; and
   filtering a ripple in the output signal of the switching power supply by aligning a resonant notch region of a frequency response of a filter circuit with a ripple frequency of the switching power supply, the filter circuit including a magnetically-coupled inductor circuit comprising at least two mutually-magnetically-coupled inductors and a variable capacitor; and
   electronically adjusting a capacitance value of the variable capacitor to align the resonant notch region of a frequency response of the filter circuit with the ripple frequency of the switching power supply.

18. The method of claim 17, comprising measuring a ripple of a filtered output signal, wherein the aligning of the resonant notch region of the frequency response of the output filter circuit with the ripple frequency of the switching power supply includes using information about a measured ripple of the filtered output signal.

19. The method of claim 17, comprising adjusting a switching frequency of the switching power supply to align a ripple frequency of the switching power supply with the resonant notch region of the frequency response of the filter circuit.

20. The method of claim 17, comprising:
   determining a phase difference of a filtered output signal compared to the output signal from the switching power supply received at a filter circuit input; and
   in response, electronically adjusting the capacitance value of the variable capacitor to align the resonant notch region of the frequency response of the filter with the ripple frequency of the switching power supply.

* * * * *